United States Patent
Wild et al.

(10) Patent No.: US 7,700,402 B2
(45) Date of Patent: Apr. 20, 2010

(54) METHOD FOR PRODUCTION OF A FILM

(75) Inventors: Heinrich Wild, Herzogenaurach (DE); Ludwig Brehm, Adelsdorf (DE); Achim Hansen, Zug (CH)

(73) Assignee: Leonhard Kurz Stiftung & Co. KG, Furth (DE)

( * ) Notice: Subject to any disclaimer, the term of this patent is extended or adjusted under 35 U.S.C. 154(b) by 818 days.

(21) Appl. No.: 10/576,098

(22) PCT Filed: Oct. 19, 2004

(86) PCT No.: PCT/DE2004/002319

§ 371 (c)(1),
(2), (4) Date: Apr. 17, 2006

(87) PCT Pub. No.: WO2005/039868

PCT Pub. Date: May 6, 2005

(65) Prior Publication Data

US 2007/0077679 A1 Apr. 5, 2007

(30) Foreign Application Priority Data

Oct. 24, 2003 (DE) .............................. 103 49 963

(51) Int. Cl.
H01L 51/40 (2006.01)
(52) U.S. Cl. ......................................... 438/99; 438/82
(58) Field of Classification Search .................... 438/99
See application file for complete search history.

(56) References Cited

FOREIGN PATENT DOCUMENTS

| DE | 196 33 675 A1 | 2/1998 |
|----|---------------|--------|
| DE | 100 33 112 A1 | 1/2002 |
| EP | 0442123       | 8/1991 |
| EP | 1 041 620 A2  | 10/2000 |

(Continued)

OTHER PUBLICATIONS

A.L. Stroyuk et al., "Photopolymerization of Butyl Methacrylate in the Presence of Nanoparticles of ZnO, Sensitized to Visible Light with Xanthene Dyes," Theoretical and Experimental Chemistry, 38(5), p. 335-341 XP007904898 (2002).

(Continued)

*Primary Examiner*—Kenneth A Parker
*Assistant Examiner*—Anthony Ho
(74) *Attorney, Agent, or Firm*—Hoffmann & Baron, LLP

(57) ABSTRACT

The invention concerns a film having at least one electrical component and a process for the production of such a film. An adhesive layer comprising a radiation-cross-linkable adhesive is applied to a base film. The adhesive layer is applied to the base film in a form of being structured in pattern form and/or is irradiated in pattern form in such a way that the adhesive layer hardens with structuring in pattern form. A transfer film which comprises a carrier film and an electrical functional layer is applied to the adhesive layer. The carrier film is pulled off the film body comprising the base film, the adhesive layer and the electrical functional layer, wherein in a first region structured in pattern form the electrical functional layer remains on the base film and in a second region structured in pattern form the electrical functional layer remains on the carrier film and is pulled off the base film with the carrier film.

21 Claims, 6 Drawing Sheets

FOREIGN PATENT DOCUMENTS

| | | |
|---|---|---|
| EP | 1 326 289 A2 | 7/2003 |
| RU | 2183882 | 6/2002 |
| WO | WO 99/45582 | 9/1999 |
| WO | WO 99/49525 | 9/1999 |
| WO | WO 02/25750 A1 | 3/2002 |
| WO | WO 02/47183 A1 | 6/2002 |
| WO | WO 02/070271 A2 | 9/2002 |

OTHER PUBLICATIONS

Fujita, et al., *"Flexible Organic Field-Effect Transistors Fabricated by the Electrode-Peeling Transfer with an Assist of Self-Assembled Monolayer"*, Applied Physics Letters, vol. 82, No. 24, pp. 4373-4375 (Jun. 16, 2003).

METHOD FOR PRODUCTION OF A FILM

CROSS-REFERENCE TO RELATED APPLICATIONS

This application is a National Phase application of International Application No. PCT/DE2004/002319 filed Oct. 19, 2004, which claims priority based on German Patent Application No. 103 49 963.6, filed Oct. 24, 2003, which are both incorporated herein by reference.

BACKGROUND OF THE INVENTION

The invention concerns a film having at least one electrical component and a process for the production of such a film.

For the production of electrical components using organic semiconductor technology, for example organic field effect transistors (OFETs) or other electrical components of organic polymers, structuring at least of the conductive electrode layer is required. Structuring of the other layers of such components is not absolutely necessary but can improve the efficiency and capability of such components involving organic semiconductor technology. In order to be able to produce powerful electrical components using organic semiconductor technology it is necessary in that respect for structuring of the layers to be implemented with a high level of resolution and register accuracy.

WO 02/25750 describes the production of electrodes or circuit boards using a lithography process. In that procedure a conductive organic layer comprising doped polyaniline (PANI) or polyethylene dioxthiophene (PEDOT) is applied to a substrate, for example a film, over the surface thereof, by doctor application, spraying, spin coating or screen printing. A thin layer of photoresist is applied thereto and exposed in structured form. Upon development the exposed polyaniline layer is deprotonised by the action of the developer and thus becomes non-conducting. The remaining photoresist is dissolved with a solvent. Prior to or after that step the non-conductive matrix of the organic layer is dissolved out with a non-basic solvent.

WO 02/25750 describes that a chemical compound which has a deprotonising action is applied by printing to a flat functional polymer layer for structuring purposes. The compound is preferably a base. Non-conducting regions are selectively removed by a subsequent rinsing operation.

WO 02/47183 proposes introducing functional polymers into recesses in a shaped layer for structuring layers of an organic field effect transistor. That shaped layer comprises a different organic material with insulating properties, into which a punch is impressed. The functional polymer is then introduced into those recesses by a doctor. Extremely fine structures with lateral dimensions in the range of 2 to 5 µm can be produced with that process. The doctor method is moreover not material-specific, that is to say it is suitable for structuring all layers of an organic field effect transistor. In addition the viscosity range for the doctor procedure is incomparably greater than for the printing operation so that the functional polymers can be substantially left in their consistency. Furthermore relatively thick layers in the range of up to 1 µm can be produced.

DE 100 33 112 describes a process for the production of electrical components using organic semiconductor technology, in which functional polymers are applied to a substrate or a layer which is already present, by means of a tampon printing process.

SUMMARY OF THE INVENTION

Now the object of the present invention is to improve the production of powerful components involving organic semiconductor technology and/or to specify the structure of improved components involving organic semiconductor technology.

That object is attained by a process for the production of a film with at least one electrical component, in particular involving organic semiconductor technology, wherein an adhesive layer comprising a radiation-cross-linkable adhesive is applied to a base film, in that case the adhesive layer is applied in a form structured in the form of a pattern to the base film and/or is irradiated in the form of a pattern (for example with UV-radiation) in such a way that the adhesive layer hardens structured in a pattern form, a transfer film which comprises a carrier film and an electrical functional layer is applied to the adhesive layer with an orientation of the electrical functional layer towards the adhesive layer, and the carrier film is removed from the film body including the base film, the adhesive layer and the electrical functional layer, whereby in a first region which is structured in pattern form the electrical functional layer remains on the base body and in a second region which is structured in pattern form the electrical functional layer remains on the carrier film and is removed with the carrier film from the base film.

The object of the invention is further attained by a film comprising at least one electrical component, in particular of organic semiconductor technology, which has an adhesive layer comprising a radiation-cross-linkable adhesive which is arranged between an electrical functional layer structured in pattern form and a film body of the film and joins the electrical functional layer structured in pattern form to the film body.

That object is further attained by a process for the production of a film comprising at least one electrical component in particular of organic semiconductor technology, wherein a radiation-cross-linkable wash lacquer layer is applied in a form structured in pattern form, the wash lacquer layer structured in pattern form is irradiated (for example with UV-light) so that the wash lacquer layer hardens, an electrical functional layer is applied to the wash lacquer layer and in a washing process the wash lacquer layer structured in pattern form is removed with the region thereabove of the electrical functional layer so that the electrical functional layer remains on the base body in the region structured in pattern form, to which no wash lacquer layer has been applied.

By virtue of the invention it is possible for electrical functional layers of a component of organic semiconductor technology to be structured in accurate register relationship and with a high level of resolution. Thus it is possible for example to achieve spacings between a source and a drain electrode of an organic field effect transistor, which are less than 25 µm. Further advantages of the invention are that this process is very inexpensive and is suitable for use on a large industrial scale. It is admittedly possible to achieve high levels of resolution by the use of lithographic processes. On the other hand however lithographic processes require the execution of a large number of process steps and the use of high-grade and expensive additive substances: the substrate has to be coated, masked, exposed, developed, etched and stripped. Furthermore, when using the process according to the invention, an improvement in the quality of the generated electrical components of organic semiconductor technology is achieved: the process according to the invention is a dry process by which contamination of semiconducting layers is substantially avoided. The semiconducting layers of an electrical component involving organic semiconductor technology are extremely sensitive in relation to impurities as, for example due to the protonising effect, they can alter the electrical properties of semiconducting layers, when already present in low levels of concentration. Thus for example in the case of a lithographic process it is scarcely possible to avoid organic semiconducting layers being contaminated by the necessary development, etching and stripping procedures. Furthermore it has been found that, in the direct printing of conductive polymers, the required high-resolution structuring of electrical functional layers can be achieved only at very high cost and with a very high level of complication, in particular from the point of view of adequate reproducibility. That is due in particular to the viscosity of the available printing substances which hinder printing in an adequate thickness and of adequate reproducibility, particularly with printing procedures which are available on a large technical scale. Furthermore the invention avoids thermal stressing of semiconducting layers during the production process.

The invention therefore provides an inexpensive production process for films with electrical components involving organic semiconductor technology, which can be applied on a large industrial scale and which satisfies high qualitative demands.

Advantageous configurations of the invention are set forth in the appendant claims.

In accordance with a preferred embodiment by way of example of the present invention the adhesive layer is applied by printing to the base film, structured in pattern form, by means of a printing process, the transfer film is applied to the adhesive layer, the adhesive layer is hardened by irradiation with radiation and then the carrier film is removed from the film body formed from the base film, the adhesive layer and the electrical functional layer. Accordingly the electrical functional layer remains in the regions which are printed upon with the radiation-cross-linkable adhesive. It is advantageous here that, by virtue of the differing properties of the printing substance and the differing layer thicknesses to be achieved, it is possible to attain higher levels of resolution than when using direct printing of conductive polymers. In addition it is possible to be able to use inexpensive printing procedures which can be employed on a large industrial scale such as intaglio printing, offset printing and flexoprinting.

In accordance with a further preferred embodiment of the invention the UV-cross-linkable adhesive is applied to the base film over the full surface area and is then exposed in pattern form with UV-light so that the adhesive layer hardens in a region structured in a pattern form. Then the transfer film is applied to the adhesive layer. The carrier film is then removed from the film body formed from the base film, the adhesive layer and the electrical functional layer. In that case the electrical functional layer remains on the base film in the regions which are structured in pattern form and in which the adhesive layer has not hardened and still has a certain degree of adhesiveness. In the other region, that is to say in the region in which the adhesive layer has hardened, the electrical functional layer remains on the carrier film and is removed with the carrier film. By virtue of such a procedure, structured electrical functional layers can be produced on the base film in a very high level of resolution. In addition there are cost advantages here as for example the use of high-grade intaglio gravure printing cylinders is not necessary.

In order to ensure adequate exposure of the adhesive layer in the above-described processes, it is advantageous to form the electrical functional layer from a semi-transparent material, for example a very thin metal layer, and to use a radiation-transmissive carrier film. That makes it possible for the adhesive layer to be irradiated from the side of the transfer film, through the transfer film. Alternatively it is possible for the base film to be of a radiation-transparent nature and for the adhesive layer to be exposed from the side of the base film through the base film.

In accordance with a further preferred embodiment of the invention the adhesive layer is exposed in pattern form after application of the transfer film so that the adhesive layer hardens in a region which is structured in pattern form. The carrier film is then removed from the film body formed from the base film and the electrical functional layer. In the region in which the adhesive layer has hardened structured in pattern form, the electrical functional layer is fixed by the adhesive layer and remains on the base body. In the other region in which the adhesive layer has not hardened the electrical functional layer remains on the transfer film and is removed with the carrier film. In that case it is necessary to use a radiation-cross-linkable adhesive which in the non-hardened condition has lower adhesion force in relation to the electrical functional layer than the adhesive force between the electrical functional layer and the carrier film.

The advantage of that procedure is that electrical functional layers can be produced with a very high level of resolution on the base film and that there are no limiting conditions in respect of the radiation transparency of the electrical functional layer and the base body.

The use of the process in the context of a roll-to-roll process on a large industrial scale is made possible by the use of a drum exposure device or a mask exposure device with a circulating mask belt for irradiation in a pattern configuration of the adhesive layer using UV-light.

A matter of particular significance for the process according to the invention is the use of a suitable transfer film which permits fast and precise release of the electrical functional layer from the carrier film. In that respect it has been found to be particularly desirable to provide a release layer between the carrier film and the electrical functional layer.

The electrical functional layer can be an electrically conductive layer. Particularly precise severing of the electrical functional layer at the transition of regions which on the one hand remain on the base film and on the other hand remain on the carrier film is achieved by the use of electrical functional layers which contain conductive particles, preferably nanoparticles, for example metal, carbon black or graphite particles. In that case it has been found that in particular functional layers comprising conductive nanoparticles and binding agent, in particular when there is a small proportion of binding agent, permit precise severing. In addition it has proven to be advantageous for the electrical functional layer to be compressed upon application to the base film, whereby the electrical conductivity is increased by pressing of the nanoparticles.

A high level of precision in terms of severing can also be achieved by the use of thin metal layers or thin layers of metal alloys as electrical functional layers. It is further appropriate to use electrical functional layers comprising conductive polymers or inorganically conductive layers such as for example ITO.

Depending on the respective structure of the component using organic semiconductor technology, it is possible to save on process steps when constructing the electrical component, by virtue of the use of electrically non-conducting or electrically conducting adhesives for the adhesive layer. In that respect the electrical functional layer preferably affords within the electrical component the function of a microstructured electrode layer which constitutes one or more electrodes of the electrical component, or the function of a microstructured semiconductor layer which affords one or more semiconducting component parts of the electrical component.

BRIEF DESCRIPTION OF THE DRAWINGS

The invention is described by way of example hereinafter by means of a number of embodiments with reference to the accompanying drawings in which.

DETAILED DESCRIPTION OF THE INVENTION

Figure 1:
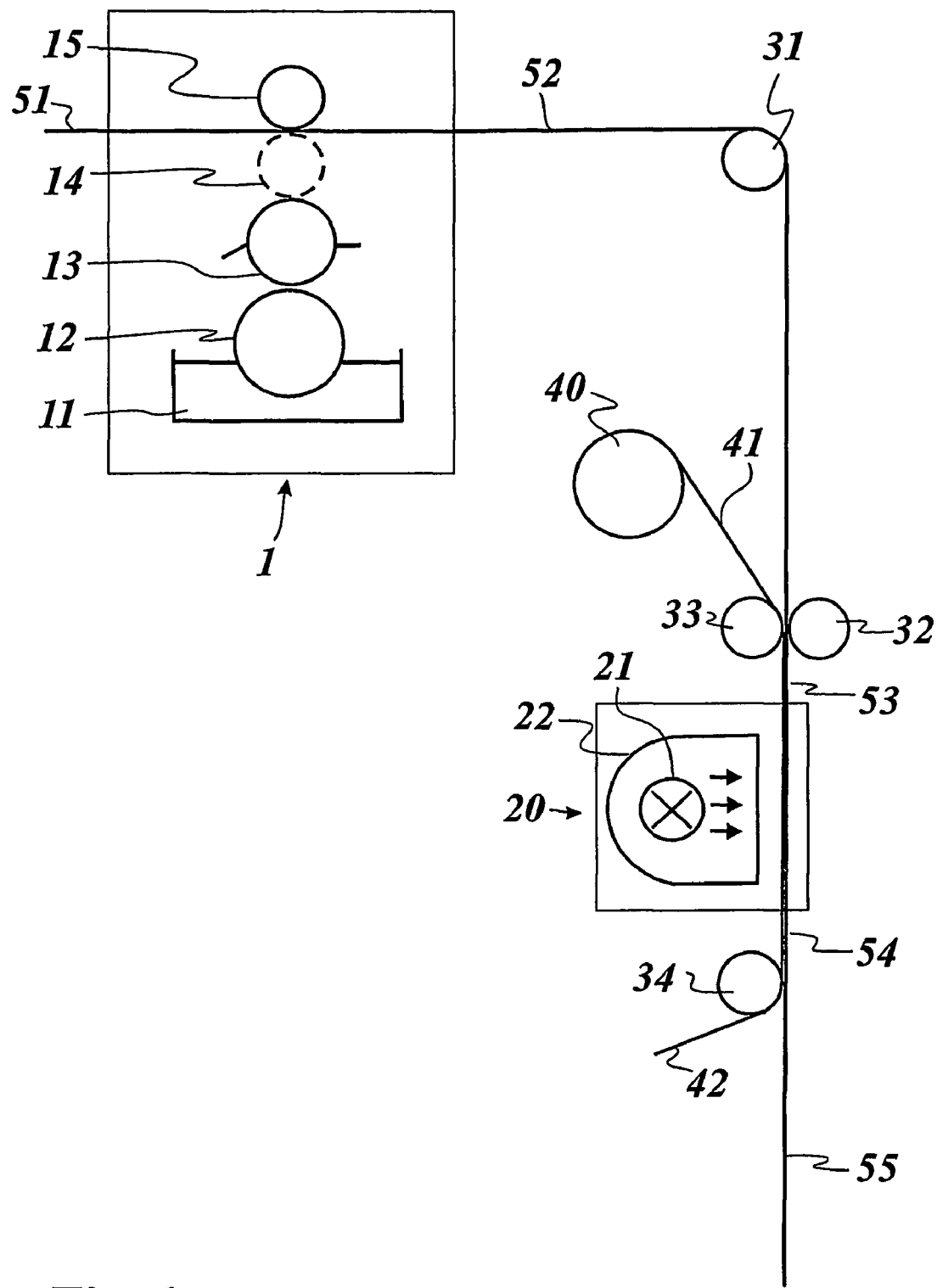
FIG. 1 shows a functional representation of a process implementation in accordance with a first embodiment of the invention.

FIG. 1 diagrammatically shows a portion of a roll-to-roll production process, by means of which a film having at least one electrical component of organic semiconductor technology is produced.

In this respect the term electrical components of organic semiconductor technology is used to denote electrical components which include at least one layer of an organic semiconductor material. Organic semiconductor materials, organic conductive materials and organic insulating materials are formed in this case by organic, metal-organic and/or inorganic substances which have the respective electrical properties. In this respect those organic, metal-organic and/or inorganic materials which can be used in the construction of components of organic semiconductor technology are referred to as functional polymers. Accordingly the term functional polymer also includes non-polymer component parts. Components which include an organic semiconductor layer or semiconductor layer regions as a functional component part are for example transistors, FETs, triacs, diodes and so forth. Here for example polythiophene can be used as an organic semiconductor material.

FIG. 1 now shows a printing station 1, an exposure station 20, a deflection roller 31 and three rollers 32, 33 and 34. A base film 51 is fed to the printing station 1. The base film 1 which is processed by the printing station 10 is fed in the form of a film 52 by way of the deflection roller 31 to the pair of rollers 32 and 33 which apply to the film 52 a transfer film 41 which is unrolled from a transfer film roll 40. That gives the film 53. The film 53 which is processed by the exposure station 20 is fed in the form of a film 54 to the roller 34 where a carrier film 42 is pulled off the film 54 and a film 55 remains as a residual film.

In the simplest case the base film 51 can be a carrier film. Such a carrier film preferably comprises a plastic film of a thickness of 6 μm to 200 μm, for example a polyester film of a thickness of 19 μm to 38 μm. Usually however the base film 51, besides such a carrier film, will have still further layers which are applied in preceding process operations. Layers of that kind are for example lacquer layers, insulating layers and electrical functional layers. Thus it is possible for the base film 51 already to include one or more functional polymer layers, for example layers of organically conductive polymers such as polyaniline and polypyrrol, semiconducting layers, for example of polythiophene, and insulating layers, for example of polyvinyl phenol. In that respect it is also possible for those layers already to be present in structured form in the base film 51.

The printing station 1 has an ink tank with a UV-cross-linkable adhesive 11. The adhesive 11 is applied to the printing cylinder 14 by means of a plurality of transfer rollers 12 and 13. The printing cylinder 14 now applies an adhesive layer of the UV-cross-linkable adhesive 11 structured in pattern form to the base film 51 which passes through between the printing cylinder 14 and a backing impression roller 15.

The printing station 1 preferably involves an offset printing or flexoprinting station. It is however also possible for the printing station 1 to be an intaglio printing station.

The adhesive layer 57 is preferably of a thickness of 0.5 μm to 10 μm.

The following adhesives can preferably be used as the UV-cross-linkable adhesive 11:

Filmbond UVH 0002 from AKZO NOBEL INKS and UVAFLEX UV Adhesive VL000ZA from Zeller+Gmelin GmbH.

Preferably the adhesives are applied to the base film 51 with an application weight of 1 $g/m^2$-5 $g/m^2$.

Figure 4A:
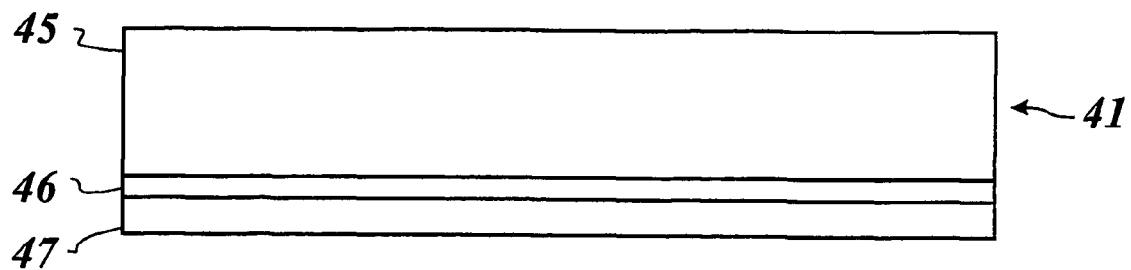
FIGS. 4a to 4d show sectional views of film bodies for the process implementation of FIG. 1, and FIGS. 5a to 5e show sectional views of film bodies to illustrate a further embodiment of the invention.
Figure 4B:
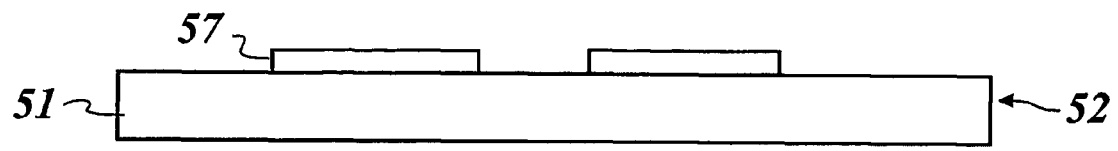

The printing operation thus affords the film 52 which is shown in FIG. 4b and in respect of which an adhesive layer 57 structured in pattern form is applied to the base body 51.

Depending on the respective nature of the adhesive 11 used it is also possible in that respect for the film 52 to pass through a drying passage in which the adhesive layer 57 is dried for example at a temperature of 100 to 120° C.

FIG. 4a shows the structure of the transfer film 41. The transfer film 41 has a carrier film 45, a release layer 46 and an electrical functional layer 47.

The carrier film 45 is an adhesive film of a thickness of 4 to 75 μm. Preferably the carrier film 45 is a film of polyester, polyethylene, an acrylate or a foamed composite material. The thickness of the carrier film is preferably 12 μm.

The release layer 46 preferably comprises a type of wax. It is also possible to dispense with the release layer 46 if the materials of the carrier film 45 and the electrical functional layer 47 are so selected that the adhesion forces between the electrical functional layer 47 and the carrier film 45 do not impede reliable and rapid release of the electrical functional layer 47.

The release layer 46 can be produced for example in accordance with the following composition:

| Release layer 46 (separation layer) | |
| --- | --- |
| Toluene | 99.5 parts |
| Ester wax (dropping point 90° C.) | 0.5 part |

Preferably the release layer 46 is applied to the carrier film 45 in a thickness of 0.01 to 0.2 μm.

Depending on the respective function which the electrical functional layer is to implement within the electrical component to be produced, the electrical functional layer 47 is composed of electrically conductive or semiconducting materials. For the situation where the electrical functional layer 47 is to form an electrically conductive functional layer, there are the following options in regard to the configuration of the electrical functional layer 47:

On the one hand it is possible for the electrical functional layer 47 to be formed by a thin metal layer with which the film body comprising the carrier film 45 and the release layer 46 is coated for example by vapour deposition. The thickness of a thin metal layer of that kind is preferably in the range of 5 nm to 50 nm in order to ensure sufficiently high-resolution structurability of the electrical functional layer by means of the process according to the invention. The metal layer here can comprise for example aluminium, silver, copper, gold, chromium, nickel or alloys with those metals.

Particularly good results can be achieved if a layer of conductive nanoparticles is applied as the electrical functional layer 47. The electrical functional layer 47 is for example of a thickness of 50 nm to 1 μm and is composed of conductive nanoparticles and binding agent, wherein the proportion of binding agent is kept low in order to ensure precise separation of the layer 47. In that case the thickness of the electrical functional layer 47 is also determined substantially by the electrical properties, for example resistivity, required of the electrical functional layer 47 in the context of the electrical component. In that respect it is also possible for the conductivity of the layer 47 to reach the desired value only upon application of the transfer film 41 to the film 52. The electrical functional layer 47 is compressed by the pressure applied in that application procedure to the electrical functional layer 47, whereby the spacings between the electrically conductive nanoparticles are reduced and the electrical conductivity of the layer 47 is considerably increased.

In addition it is also possible for the electrical functional layer 47 to be a layer of other conductive materials, for example ITO materials (ITO=indium tin oxide), or other transparent conductive oxides, for example aluminium-doped zinc oxide or electrically conductive polymers, for example polyaniline and polypyrrol.

In addition it is also possible for the electrical functional layer 47 to be formed by a semiconducting material. For that purpose an organic semiconductor material is applied to the release layer 46 in liquid dissolved form or in the form of a suspension, and then solidified. The thickness of an electrical functional layer 47 of that kind is in that case determined substantially by the electrical function of that layer within the electrical component to be produced.

The conductive nanoparticles are preferably applied to the release layer 46 in the form of a dispersion which is not greatly diluted.

Figure 4C:
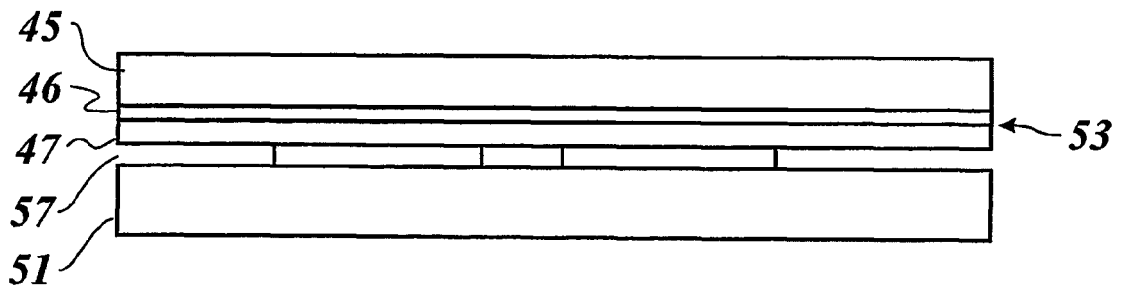

FIG. 4c shows the film 53, that is to say the film body which is produced after application of the transfer film 41 to the base film 51 which is printed with the adhesive layer 57 structured in pattern form. FIG. 4c shows the base film 51, the adhesive layer 57, the electrical functional layer 47, the release layer 46 and the carrier film 45. The pressing force by means of which the transfer film 41 is applied to the film 52 by means of the printing and impression rollers 32 and 33 is to be so selected that the pattern structuring of the adhesive layer 47 is not substantially influenced thereby.

The exposure station 20 shown in FIG. 1 has a UV-lamp 21 and a reflector 22 which focuses the UV-radiation emitted by the UV-lamp 21 on to the film 53. The power of the UV-lamp 21 is so selected in that situation that, as it passes through the exposure station 22, the adhesive layer 57 is irradiated with a sufficient amount of energy which ensures reliable hardening of the adhesive layer 57. As shown in FIG. 1 the film 53 is irradiated in that case from the side of the carrier film 45. That is possible if a transparent or semi-transparent layer is used as the electrical functional layer 47, for example a thin metal layer of a nature as set forth in hereinbefore. In addition it is necessary for that purpose for the carrier film 45 and the release layer 46 to comprise a UV-transparent material. If, by virtue of the specific composition of the electrical functional layer 47, it should not be possible to make that layer UV-transparent or semi-transparent, it is possible for the film 53 to be irradiated with UV-light from the side of the base film 51. In that case the base film 51 would then have to be UV-transparent in nature.

The functional layer 47 is caused to adhere to the base film 51 at the locations at which the adhesive layer 57 is provided, by virtue of hardening of the adhesive layer 57 which is structured in pattern form. If thereafter the carrier film 45 is pulled off the remaining film body of the film 53, the electrical functional layer 47 adheres to the base film 51 in the regions in which the adhesive layer 57 is applied by printing, and is thus detached at those locations from the transfer film 41. At the other locations the adhesion between the electrical functional layer 47 and the release layer 46 predominates so that here the electrical functional layer 47 remains in the transfer film 41.

Figure 4D:
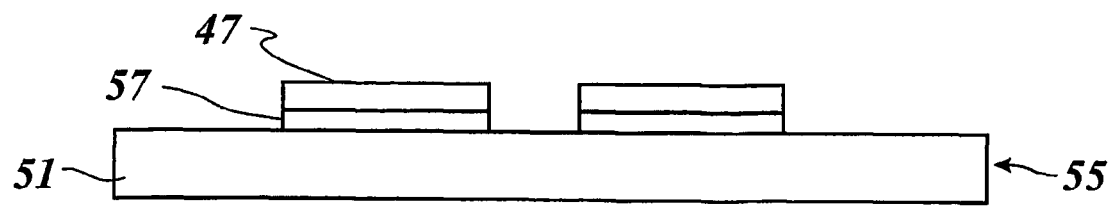

FIG. 4d now shows the film 55, that is to say the resulting film body after removal of the carrier film 45. FIG. 4d shows the base film 51, the adhesive layer 57 and the electrical functional layer 47. As shown in FIG. 4d the film 55 now has an electrical functional layer 47 which is structured in pattern form and which is arranged on the base film 55 in accordance with the adhesive layer 57 which is structured in pattern form.

A further embodiment of the invention will now be described with reference to FIG. 2.

Figure 2:
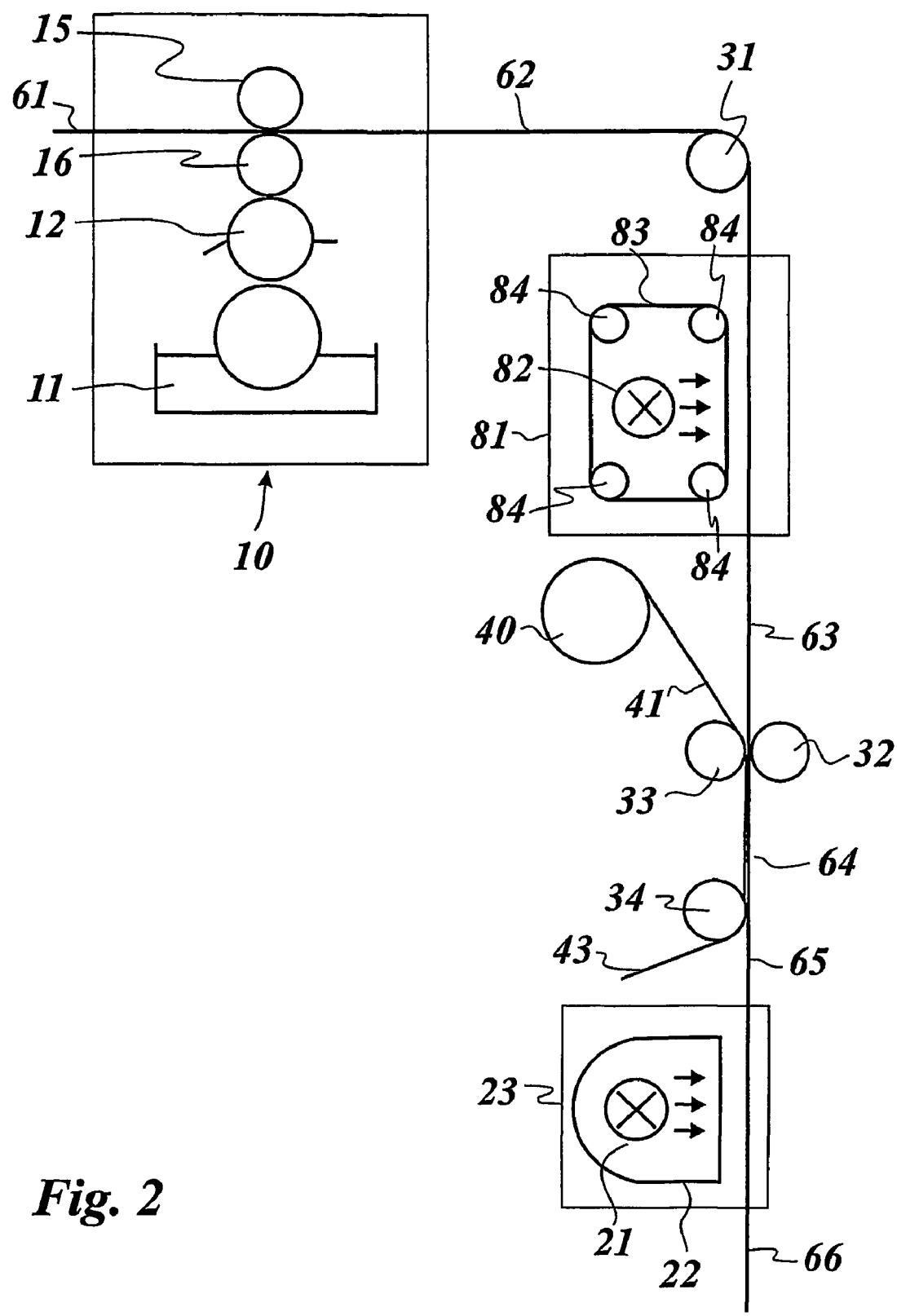
FIG. 2 shows a functional representation of a process implementation in accordance with a further embodiment of the invention.

FIG. 2 shows a printing station 10, an exposure station 81, an exposure station 23, the deflection roller 31, the printing and impression rollers 32 and 33, the release roller 34 and the transfer film roll 40.

The printing station 10 is constructed like the printing station 1 shown in FIG. 1, with the difference that the printing cylinder 14 is replaced by a printing cylinder 16 which applies the adhesive 11 to a supplied base film 61 by printing over the full surface area thereof. In that respect it is also possible for the adhesive layer to be applied to the base film 61 not by a printing process but by another coating process, for example spreading, pouring or spraying. Here too it is also possible for the adhesive layer also to be applied to the base film 61 in pattern form and thus for the process described here to be combined with the process shown in FIG. 1.

The base film 61 and the adhesive layer of a UV-cross-linkable adhesive applied to the base film by printing are like the base film 51 and the adhesive layer 57 shown in FIG. 4b, with the difference that here the adhesive layer 57 is preferably applied to the base film 61 over the full surface area. The film body 62 provided after application of the adhesive layer to the base film 61 is fed by way of the deflection roller 31 to the exposure station 81.

Preferably a pre-polymer UV-cross-linkable adhesive is used in this case.

The exposure station 81 is a mask exposure device which permits exposure from roll to roll by means of a mask belt which is synchronised with the speed of movement of the film 52. The mask exposure device 81 thus has a plurality of deflection rollers 84, a mask belt 83 and a UV-lamp 82. The mask belt 83 has UV-transparent and opaque or reflecting regions. The mask belt thus forms an endless UV-mask which covers the film 62 in relation to the UV-lamp 82 and permits continuous irradiation of the film 62 in pattern form with UV-light. As already mentioned above the speed of the mask belt 83 is synchronised with the speed of the film 62, in which respect additional optical markings on the film 62 permit exposure in accurate register relationship. In that case the power of the UV-lamp 82 is so selected that an amount of UV-energy sufficient for hardening the adhesive layer is supplied to the film 62 on passing through the mask exposure device 81.

Preferably the film is irradiated by the mask exposure device 81 with collimated UV-light.

Instead of a mask exposure device operating with a mask belt, it is also possible to use a drum exposure device having a mask in the form of a drum over which the film 62 is passed.

Irradiation with UV-light in a pattern configuration causes the adhesive layer to be hardened with structuring in pattern form so that a film 63 with hardened and non-hardened regions of the adhesive layer is fed to the pair of rollers 32 and 33. The transfer film 41 is now applied to the film 63 by the pair of rollers 32 and 33. In that case the transfer film 41 is like the transfer film 49 of FIG. 4a. Accordingly the result is a film 64 comprising the base film 61, a partially hardened adhesive layer, the electrical functional layer 47, the release layer 46 and the carrier film 45. In the regions in which the adhesive layer has not hardened, the adhesive layer is still sticky so that here adhesion forces are operative between the adhesive layer and the electrical functional layer 47 which is disposed thereover. In the other regions in which the adhesive layer has hardened that is not the case. Therefore, when the carrier film 45 is pulled off the remaining film body the electrical functional layer adheres to the base body 51 in the regions in which the adhesive layer has not hardened, and is thus released from the carrier film 48. In the other regions the adhesion forces between the release layer 46 and the electrical functional layer 47 provide that, in those regions, the electrical functional layer 47 is not detached and remains on the carrier film 45. Accordingly, after removal of the carrier film 45, that affords a film 65 with a partial patterned electrical functional layer 47 which is joined to the base film 61 by way of an adhesive layer over the full surface area involved. In a further exposure station 23 which is like the exposure station 20 shown in FIG. 1 the adhesive layer is now completely hardened in the regions which have not yet been hardened in order to ensure a secure join between the electrical functional layer 47 and the base film 61. It would however also be possible to dispense with the exposure station 23.

A further embodiment of the invention will now be described with reference to FIG. 3.

Figure 3:
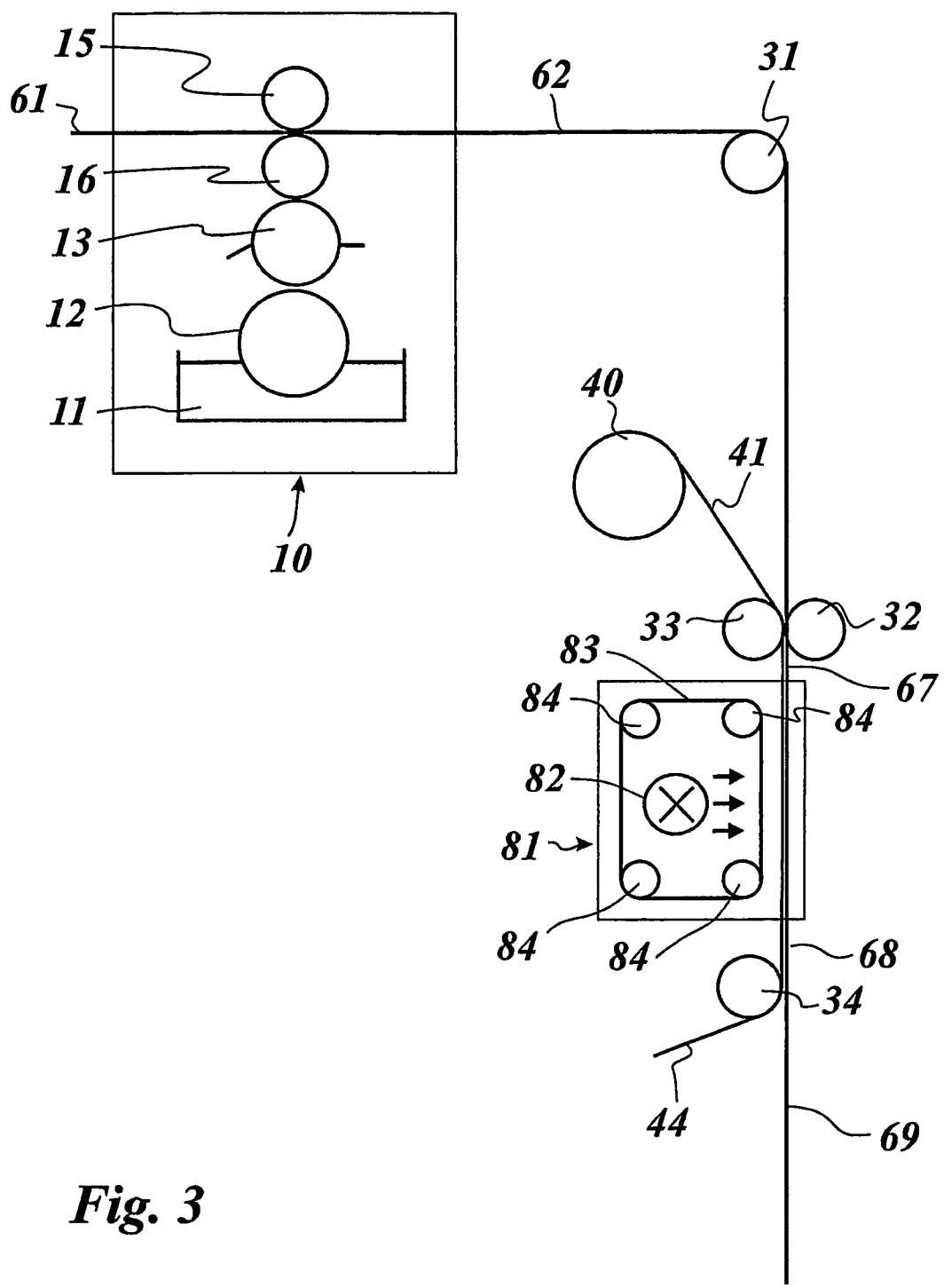
FIG. 3 shows a functional representation of a process implementation in accordance with a further embodiment of the invention.

FIG. 3 shows the printing station 10, the exposure station 81, the deflection roller 31, the printing and impression rollers 32 and 33, the release roller 34 and the transfer film roll 40.

The base film 61 is fed to the printing station 10 and is coated as shown in FIG. 2 with an adhesive layer, thereby producing the film 62 as shown in FIG. 2. The transfer film 41 is now applied to the film 62 by the pair of rollers 32 and 33. In this case the transfer film 41 is of the configuration as shown in FIG. 4a. This therefore involves a film 67 comprising the base film 61, an adhesive layer which has not hardened and which covers the full surface area, the electrical functional layer 47, the release layer 46 and the carrier film 45.

The film 46 is now exposed by means of the mask exposure device 81 which again is like the mask exposure device 81 shown in FIG. 2. After exposure by means of the mask exposure device 81 the result is therefore a film 68 comprising the base film 61, an adhesive layer hardened with structuring in pattern form, the electrical functional layer 47, the release layer 46 and the carrier film 45.

In contrast to the embodiment shown in FIG. 2, this embodiment uses a UV-cross-linkable adhesive, the adhesion force of which in relation to the electrical functional layer 47 or in relation to the base film 61 is less than the adhesion force between the electrical functional layer 47 and the carrier film 45. Naturally it is also possible to use the same adhesive as in FIG. 1 or FIG. 2 and to provide for suitable distribution of the adhesion forces by the choice of the materials for the carrier film 45, the base body 51 or the release layer 46.

If therefore the carrier film 45 is removed from the remaining film body of the film 68, the electrical functional layer remains on the base body 61 in the regions in which the adhesive layer has hardened and thus glues the electrical functional layer 47 to the base film 61. In the other regions the adhesion forces which prevent release of the electrical functional layer 47 from the carrier film 45 are greater than the adhesion forces between the electrical functional layer 47 and the base film 61 so that the electrical functional layer 47 is not released from the carrier film 45 in those regions.

That therefore affords a film 69 having an electrical functional layer 47 which is structured in pattern form and which is joined to the base film 61 by way of a hardened adhesive layer which is suitably structured in pattern form.

Reference will now be made to FIGS. 5a to 5e to describe by way of example how a field effect transistor of organic semiconductor technology can be produced by means of one of the processes shown in FIG. 1, FIG. 2 or FIG. 3.

Figure 5A:
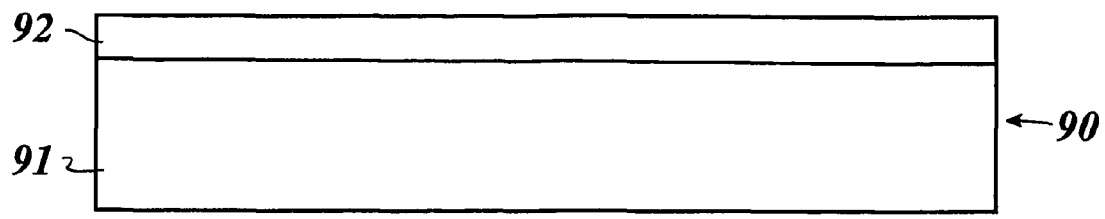

FIG. 5a shows a base film 90 comprising a carrier film 91 and a lacquer layer 92 applied thereto.

The carrier film 91 is a plastic film, preferably a polyester film of a thickness of 19 μm to 38 μm. The lacquer layer 92 is a lacquer layer of an electrically insulating material which additionally acts as a protective lacquer layer. That lacquer layer is preferably applied in a layer thickness of 0.5 to 5 μm to the carrier film 91 or to a release layer disposed between the carrier film 91 and the lacquer layer 92.

Figure 5B:
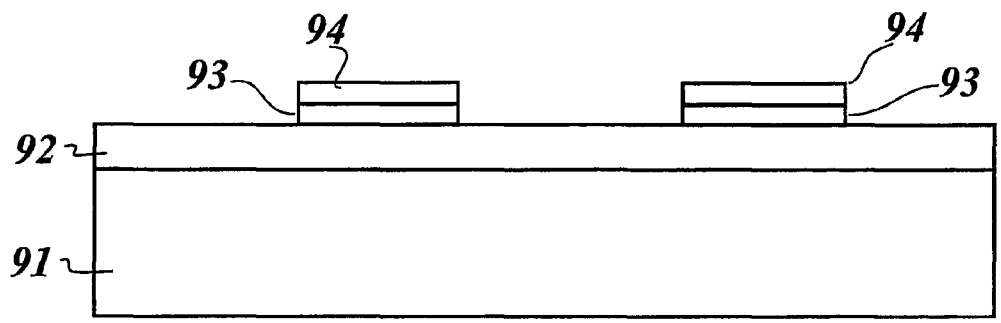

Now, as shown in FIG. 5b, an electrical functional layer 94 is applied to the base film 90 by means of one of the processes shown in FIG. 1, FIG. 2 or FIG. 3. That gives the film body which is shown in FIG. 5b and which comprises the carrier film 91, the lacquer layer 92, an adhesive layer 93 and an electrical functional layer 94. In this case the electrical functional layer 94 comprises an electrically conductive material and affords the function of a drain and a source electrode within the electrical component. Depending on the nature of the processes used it is possible in that respect for the adhesive layer 93, as shown in FIG. 5b, to be structured in pattern form in the same manner as the electrical functional layer 94, or for it to be present in hardened form on the adhesive layer 92 over the full surface area involved.

Figure 5C:
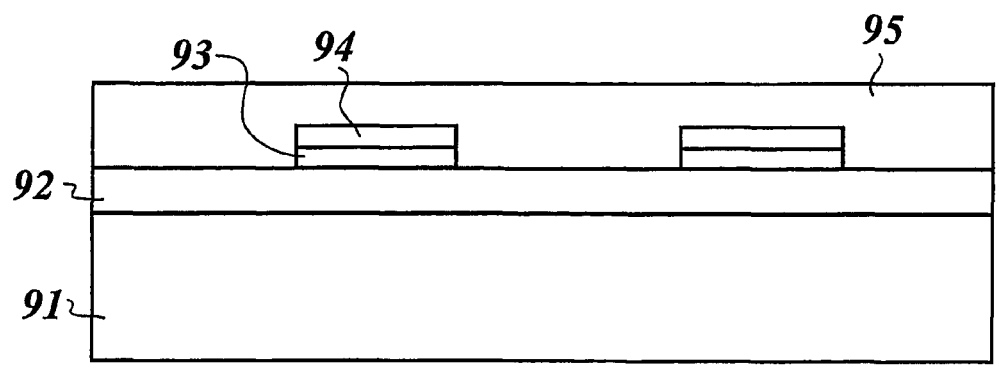

A semiconducting layer is then applied to the film body shown in FIG. 5b, thus giving the film body shown in FIG. 5c, comprising the carrier film 91, the lacquer layer 92, the adhesive layer 93, the electrical functional layer 94 and the semiconducting layer 95. The material used for the semiconducting layer 95 here is polythiophene which is applied to the film body shown in FIG. 5b in liquid, dissolved form or in the form of a suspension, and then hardened. An application of the semiconducting layer 95, structured in pattern form, is also possible.

The film body shown in FIG. 5c now forms a base film to which an electrical functional layer 94 is applied by means of one of the processes shown in FIG. 1, FIG. 2 or FIG. 3. FIG. 5c shows the resulting film body comprising the carrier film 91, the lacquer layer 92, the adhesive layer 93, the electrical functional layer 94, the semiconducting layer 95, the adhesive layer 96 and the electrical functional layer 97.

The electrical functional layer 97 here also comprises an electrically conductive material and acts as a gate electrode within the electrical component. The adhesive layer 96 is shaped with structuring in pattern form, like the electrical functional layer 97 disposed thereover. When using the processes of FIG. 2 or FIG. 3 however it is also possible for the adhesive layer 96 to be applied to the semiconducting layer 95 over the full surface area involved.

Figure 5D:
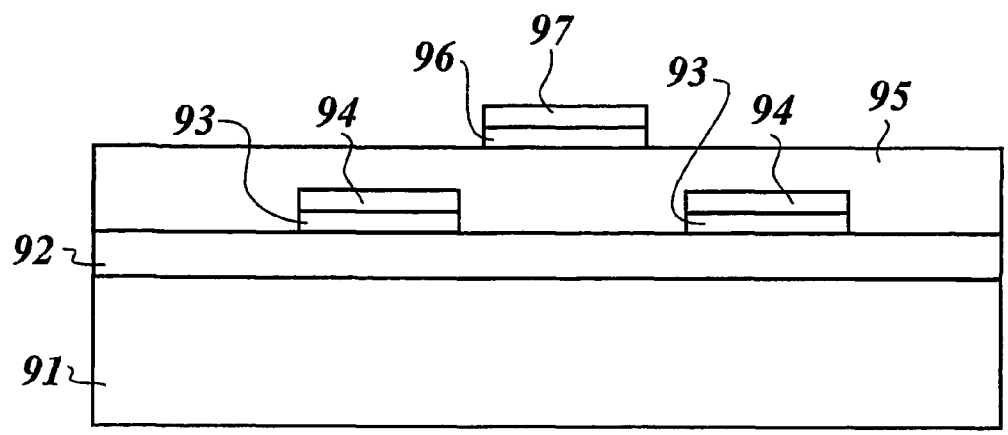
Figure 5E:
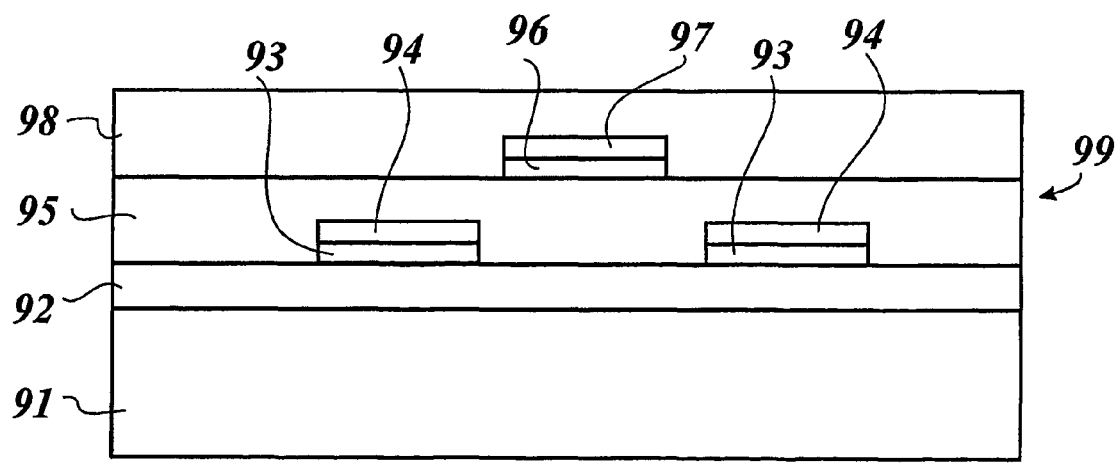

In a further process step a further lacquer layer of an electrically insulating material is now applied to the film body shown in FIG. 5d, that further lacquer layer subsequently also performing the function of a protection layer for the semiconducting layer 95. As shown in FIG. 5e that therefore gives a film 99 comprising the carrier film 91, the lacquer layers 92 and 98, the semiconducting layer 95, the adhesive layers 93 and 96 and the electrical functional layers 94 and 97.

The invention claimed is:

1. A process for the production of a film having at least one electrical component, in particular of organic semiconductor technology, wherein an adhesive layer comprising a radiation-cross-linkable adhesive is applied to a base film, the adhesive layer of the radiation-cross-linkable adhesive is applied in a form structured in pattern form to the base film and/or is irradiated in the form of a pattern in such a way that the adhesive layer hardens structured in a pattern form, a transfer film which comprises a carrier film and an electrical functional layer is applied to the adhesive layer with an orientation of the electrical functional layer to the adhesive layer, and the carrier film is removed from the film body including the base film, the adhesive layer and the electrical functional layer, wherein in a first region which is structured in pattern form the electrical functional layer remains as part of the electrical component on the adhesive layer and on the base film and in a second region which is structured in pattern form the electrical functional layer remains on the carrier film and is removed with the carrier film from the base film, wherein the adhesive layer comprising a radiation-cross-linkable adhesive is irradiated in pattern form after application of the transfer film, whereby the adhesive layer hardens in a region structured in pattern form, and the carrier film is removed from the film body including the base film, the adhesive layer and the electrical functional layer, so that the electrical functional layer remains on the base film in the first region which is structured in pattern form and in which the adhesive layer is hardened and is removed with the carrier film in the second region in which the adhesive layer is not hardened.

2. A process according to claim 1, wherein the adhesive layer comprising the radiation-cross-linkable adhesive is applied to the base film by means of a printing process with structuring in pattern form.

3. A process according to claim 2, wherein the transfer film is radiation-transparent and the adhesive layer is exposed from the side of the transfer film through the transfer film.

4. A process according to claim 2, wherein the base film is radiation-transparent and the adhesive layer is exposed from the side of the base film through the base film.

5. A process according to claim 1, wherein the adhesive layer is printed on to the base film by means of intaglio printing.

6. A process according to claim 1, wherein the adhesive layer is printed on to the base film by means of offset printing or flexoprinting.

7. A process according to claim 1, wherein a radiation cross-linkable adhesive is used, which in the non-hardened condition has a lower adhesion force with respect to the electrical functional layer than the adhesion force between the electrical functional layer and the carrier film.

8. A process according to claim 1, wherein a mask exposure device, in particular a drum exposure device or a mask exposure device with a mask belt is used for the exposure operation.

9. A process according to claim 1, wherein a transfer film is used, which has a release layer between the carrier film and the electrical functional layer.

10. A process according to claim 1, wherein the electrical functional layer is an electrically conductive layer.

11. A process according to claim 10, wherein the electrical functional layer contains conductive nanoparticles, in particular metal, carbon black or graphite particles.

12. A process according to claim 11, wherein the electrical functional layer comprises conductive nanoparticles and binding agent.

13. A process according to claim 11, wherein the electrical functional layer is compressed upon being applied to the base film, whereby the electrical conductivity of the functional layer is increased.

14. A process according to claim 10, wherein the electrical functional layer contains conductive polymers.

15. A process according to claim 10, wherein the electrical functional layer contains inorganic substances, for example ITO material.

16. A process according to claim 10, wherein the electrical functional layer is a metal layer or a layer of a metal alloy.

17. A process according to claim 1, wherein the electrical functional layer is an electrical semiconducting layer which has in particular semiconducting polymers.

18. A process according to claim 1, wherein the adhesive layer comprises an electrically non-conductive adhesive.

19. A process according to claim 1, wherein the adhesive layer comprises an electrically conductive adhesive.

20. A process for the production of a film having at least one electrical component, in particular of organic semiconductor technology, wherein an adhesive layer comprising a radiation-cross-linkable adhesive is applied to a base film, the adhesive layer is applied in a form structured in pattern form to the base film and/or is irradiated in the form of a pattern in such a way that the adhesive layer hardens structured in a pattern form, a transfer film which comprises a carrier film and an electrical functional layer is applied to the adhesive layer with an orientation of the electrical functional layer to the adhesive layer and the carrier film is removed from the film body including the base film, the adhesive layer and the electrical functional layer, wherein in a first region which is structured in pattern form the electrical functional layer remains as part of the electrical component on the adhesive layer and on the base film and in a second region which is structured in pattern form the electrical functional layer remains on the carrier film and is removed with the carrier film from the base film, wherein the adhesive layer comprising the radiation-cross-linkable adhesive is irradiated in pattern form prior to the application of the transfer film in such a way that the adhesive layer hardens in a region structured in pattern form, the transfer film is applied to the adhesive layer which is hardened structured in pattern form and the carrier film is removed from the film body including the base film, the adhesive layer and the electrical functional layer, so that the electrical functional layer remains on the base film in the first region which is structured in pattern form and in which the adhesive layer is not hardened and is removed with the carrier film in the second region which is structured in pattern form and in which the adhesive layer is hardened.

21. A process according to claim 20, wherein the adhesive layer is then irradiated in a second exposure step for hardening the regions of the adhesive layer, which are not yet hardened.

* * * * *